United States Patent
Lebedev

(10) Patent No.: US 12,556,173 B2
(45) Date of Patent: Feb. 17, 2026

(54) STRONGARM COMPARATOR AND ASYNCHRONOUS SAR ADC

(71) Applicant: Huawei Technologies Co., Ltd., Shenzhen (CN)

(72) Inventor: Semyon Lebedev, Ottawa (CA)

(73) Assignee: HUAWEI TECHNOLOGIES CO., LTD., Shenzhen (CN)

( * ) Notice: Subject to any disclaimer, the term of this patent is extended or adjusted under 35 U.S.C. 154(b) by 89 days.

(21) Appl. No.: 18/639,349

(22) Filed: Apr. 18, 2024

(65) Prior Publication Data

US 2025/0330163 A1   Oct. 23, 2025

(51) Int. Cl.
*H03K 5/24* (2006.01)
*H03M 1/46* (2006.01)

(52) U.S. Cl.
CPC ........... *H03K 5/249* (2013.01); *H03K 5/2481* (2013.01); *H03M 1/466* (2013.01)

(58) Field of Classification Search
CPC ...... H03K 5/249; H03K 5/2481; H03M 1/466
USPC ........................................ 341/155, 158, 161
See application file for complete search history.

(56) References Cited

U.S. PATENT DOCUMENTS

| | | | | |
|---|---|---|---|---|
| 6,184,722 B1* | 2/2001 | Hayakawa | ....... | H03K 3/356156 327/55 |
| 6,456,120 B1* | 9/2002 | Huang | ............. | H03K 3/356139 365/207 |
| 11,843,386 B1* | 12/2023 | Dalena | ................. | H03K 5/2454 |
| 2020/0389160 A1* | 12/2020 | Almansouri | ....... | H03K 17/6872 |

OTHER PUBLICATIONS

Khairi et al., "A 1.41-pJ/b 224-GB/s PAM4 6-bit ADC-Based SerDes Receiver With Hybrid AFE Capable of Supporting Long Reach Channels," IEEE Journal of Solid-State Circuits, vol. 58 Issue: 1, 8-18, Jan. 2023, 11 pages.
B. Razavi, "The StrongARM Latch [A Circuit for All Seasons]," in IEEE Solid-State Circuits Magazine, vol. 7, No. 2, pp. 12-17, Spring 2015.

* cited by examiner

*Primary Examiner* — Khai M Nguyen
(74) *Attorney, Agent, or Firm* — Slater Matsil, LLP

(57) ABSTRACT

Provided are a StrongArm comparator and an SAR ADC. The StrongArm comparator includes an input module, a latch module, a first reset unit and a shunt unit. The input module is configured to receive a pair of differential input voltages, and the latch module is configured to generate a pair of differential output voltages. Operation of the first reset unit is controlled by a first clock signal, discharging of the coupling nodes of the input and latch modules through the input module is activated by an active pulse of the first clock signal, and discharging of the coupling nodes through the shunt unit is activated by an active pulse of a second clock signal, where a leading edge of the active pulse of the second clock signal lags behind the active pulse of the first clock signal, and trailing edges of the first and second clock signals end simultaneously.

8 Claims, 15 Drawing Sheets

(1)

Ready detector (2)

(a)

(b)

US 12,556,173 B2

STRONGARM COMPARATOR AND ASYNCHRONOUS SAR ADC

TECHNICAL FIELD

The present disclosure relates to the field of technologies of electronics, and in particular, to a StrongArm comparator and an asynchronous successive approximation register (SAR) analog-to-digital converter (ADC).

BACKGROUND

An Analog-to-Digital converter (ADC) can be used for converting analog signals to digital signals, so that a controller (e.g., a microprocessor) can perform analysis and processing based on the digital signals. There may be many kinds of ADCs, where SAR (successive approximation register) ADC is widely used in digital signal processing.

The asynchronous SAR ADC is a mixed signal design with an external sampling clock and an internally generated asynchronous clock for producing successive digital N-bit outputs. The clock cycle of the external sampling clock is generally constant and known. However, the internal asynchronous clock has a variable cycle that may vary from bit to bit and from sample to sample.

This background information is provided to reveal information believed by the applicant to be of possible relevance to the present disclosure. No admission is necessarily intended, nor should be construed, that any of the preceding information constitutes prior art against the present disclosure.

SUMMARY

In a first aspect, a StrongArm comparator is provided by the present disclosure, and the StrongArm comparator comprises:
  an input module, configured to receive a pair of differential input voltages;
  a latch module, coupled between a first supply and the input module, and configured to generate a pair of differential output voltages;
  a reset module, comprising a first reset unit and a shunt unit, wherein the first reset unit is coupled between the first supply and internal nodes of the StrongArm comparator, and operation of the first reset unit is controlled by a first clock signal; wherein the shunt unit is coupled between a second supply and coupling nodes of the input module and the latch module;
  wherein discharging of the coupling nodes through the input module for triggering the generation of the pair of differential output voltages is activated by an active pulse of the first clock signal, and discharging of the coupling nodes through the shunt unit is activated by an active pulse of a second clock signal, wherein a leading edge of the active pulse of the second clock signal lags behind a leading edge of the active pulse of the first clock signal, and trailing edges of the first and second clock signals end simultaneously.

In a second aspect, an asynchronous successive approximation register (SAR) analog-to-digital converter (ADC) is provided by the present disclosure, the asynchronous SAR ADC is configured to convert an analog input signal into digital output signals and comprises: the StrongArm comparator according to the first aspect, a capacitive digital to analog converter (CDAC) and a control module;
  wherein differential outputs of the CDAC are coupled to the input module of the StrongArm comparator, inputs of the CDAC are coupled to outputs of the control module, outputs of the StrongArm comparator are coupled to inputs of the control module;
  the CDAC is configured to generate a succession of two differential input voltages at the input module of the StrongArm comparator to successively approximate a sampled differential voltage acquired from differential analog input ends during an active pulse of a sampling signal; wherein the generation of the succession of two differential input voltages is based on successive approximation logic signals from the control module;
  the StrongArm comparator is configured to generate, based on the first clock signal from the control module, a comparison signal representing a comparison result between the two differential input voltages, wherein the comparison result indicates a bit value of the digital output signals to be stored in the control module;
  the control module is configured to detect the comparison signal, generate the first clock signal for the StrongArm comparator based on the detection of the comparison signal, the sampling signal and a first reset signal for resetting the StrongArm comparator, output the successive approximation logic signals to the CDAC based on the comparison signal, and output the digital output signals after all bit values of the digital output signals are converted.

In a third aspect, an asynchronous successive approximation register (SAR) analog-to-digital converter (ADC) is provided by the present disclosure, the asynchronous SAR ADC is configured to convert an analog input signal into digital output signals and comprises: the StrongArm comparator according to the first aspect, a capacitive digital to analog converter (CDAC), a ready detection module and a control module;
  wherein differential outputs of the CDAC are coupled to the input module of the StrongArm comparator, inputs of the CDAC are coupled to outputs of the control module, outputs of the StrongArm comparator are coupled to inputs of the control module;
  the CDAC is configured to generate a succession of two differential input voltages at the input module of the StrongArm comparator to successively approximate a sampled differential voltage acquired from differential analog input ends during an active pulse of a sampling signal; wherein the generation of the succession of two differential input voltages is based on successive approximation logic signals from the control module;
  the StrongArm comparator is configured to generate, based on the first clock signal from the control module, a comparison signal representing a comparison result between the two differential input voltages, wherein the comparison result indicates a bit value of the digital output signals to be stored in the control module;
  the ready detection module is configured to detect the comparison signal and output a ready signal indicating completion of the comparison;
  the control module is configured to generate the first clock signal for the StrongArm comparator based on the ready signal, the sampling signal, a first reset signal for resetting the StrongArm comparator, a second reset signal for resetting the inputs and the differential outputs of the CDAC, output the successive approximation logic signals to the inputs of the CDAC based on the comparison signal, and output the digital output signals after all bit values of the digital output signals are converted.

BRIEF DESCRIPTION OF THE DRAWINGS

The accompanying drawings are used to provide a further understanding of the present disclosure, constitute a part of the specification, and are used to explain the present disclosure together with the following specific embodiments, but should not be construed as limiting the present disclosure.

DETAILED DESCRIPTION OF ILLUSTRATIVE EMBODIMENTS

Figure 1:
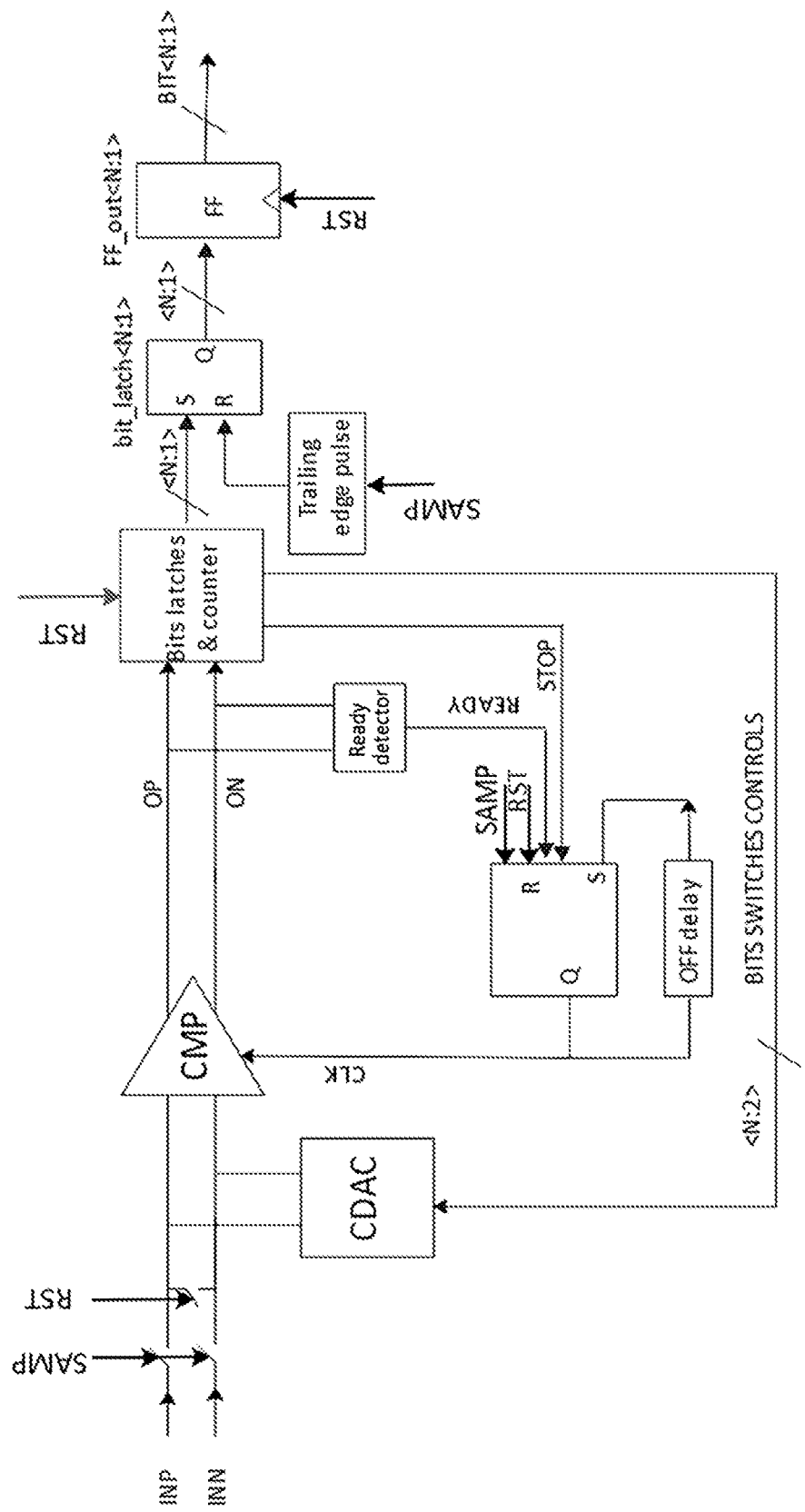
FIG. 1 is a block diagram of a conventional asynchronous SAR ADC.

In the following description, reference is made to the accompanying figures, which form part of the present disclosure, and which show, by way of illustration, specific aspects of embodiments of the present disclosure or specific aspects in which embodiments of the present disclosure may be used. It is understood that embodiments of the present disclosure may be used in other aspects and include structural or logical changes not depicted in the figures. The following detailed description, therefore, is not to be taken in a limiting sense, and the scope of the present disclosure is defined by the appended claims.

An analog-to-digital converter (ADC) may be a component of a receiver in a communication system, where the receiver may be a serializer/deserializer (SERDES) receiver (RX). ADCs can be used for converting analog signals to digital signals, so that a controller (e.g., a microprocessor) can perform analysis and processing based on the digital signals. There may be many kinds of ADCs, where successive approximation register (SAR) ADC is widely used in digital signal processing.

For sampling speeds of tens and hundreds GHz, ADCs with interleaved SAR sub-channels are used. Interleaving of sub-channels slows down the required sub-channel conversion speed. This makes implementation of ADCs with hundreds of GHz possible in Complementary Metal Oxide Semiconductor (CMOS) technologies.

When designing or selecting SAR ADCs, there are some performance indicators that may be taken into consideration.
Number of Bits SERDES RX systems may use 32-128 (and even more) sub-channels of medium resolution (e.g., 6-8 bit resolution per sub-channel), for reaching overall sampling speed of 32 GHZ-224 GHz and beyond.

For the SERDES link implementation, the number of bits is defined by the SNDR (Signal to Noise and Distortion Ratio) requirement of the SERDES RX systems. Most of the systems are using at least 7-bit conversion.
Conversion Speed and Sub-Channels Number SAR ADC may process the required number of bits within the assigned conversion time. For example, 7 bits are processed during the conversion time assigned to a single sub-channel. The conversion time is limited by the design and characteristics of the SAR ADC circuit. Knowing achievable per sub-channel conversion speed (e.g., 7-bit), one can calculate how many interleaved sub-channels are required for the target sampling rate. For example, for 128 GHz sampling rate with sub-channel conversion speed of 1 GHz and 1.33 GHZ, 128 and 96 sub-channels are required respectively. Having a bigger number of sub-channels results in greater power consumption and greater occupied chip area. Therefore, it may be necessary to have a higher conversion speed while preserving all other performance metrics.
Power Consumption Since there is a big number of interleaved sub-channels, it is important to minimize each sub-channel's power consumption while not reducing the conversion speed.

Modern ADC designs are targeting 0.75V-0.9V supply levels. Operation at lower supply saves power approximately proportional to square root of the supply value.
Occupied Chip Area Occupied chip area needs to be kept minimum possible without impacting other performance metrics.

An asynchronous SAR ADC is a mixed signal design with an external sampling clock and an internally generated asynchronous clock for producing successive digital N-bit outputs. It is important in SAR ADC to receive the fastest possible conversion time with minimum possible power consumption and occupied chip area.

FIG. 1 is a schematic diagram of a conventional asynchronous SAR ADC. As shown in FIG. 1, the asynchronous SAR ADC includes a capacitive Digital-to-Analog converter (CDAC), a comparator (CMP), a controller (bits latches & counter), a ready detector, an RS latch for clock generation, RS latches for outputting digital bits one by one, flip flops (FF) for aligning all the digital bits, etc. It should be noted that, for simplicity, some devices of the asynchronous SAR ADC are omitted in FIG. 1, such as the track and hold circuit. It should also be noted that, a differential implementation of the asynchronous SAR ADC illustrated in FIG. 1 is taken as an example in the present disclosure.

In general, the asynchronous SAR ADC receives differential input signals (e.g., through INP and INN shown in FIG. 1) in the case that input switches are turned on, e.g., during an active pulse of an external sampling clock signal (e.g., SAMP signal shown in FIG. 1), and outputs the converted N-bit digital signal in the end of conversion cycle.

FIG. 1 illustrates the asynchronous SAR ADC with differential inputs, one comparator and CDAC. One-comparator approach minimizes the input capacitive load and has relatively simple offset cancellation. SAR ADCs with one comparator are very commonly used with hundreds of variations. The analog differential structure is generally used to avoid noise problems and reduce even-order harmonics. Differential capacitive N−1 bits DAC (CDAC) is used to process the analog differential signals at the inputs of comparator. The first bit (most significant bit, MSB) is determined before the CDAC is activated, while the last bit (least significant bit, LSB) of the conversion is excluded from CMP to CDAC loop path.

While the external clock cycle (e.g., Tsample) may be constant, asynchronous timings may be used internally. In asynchronous timing, the internal clock signal (CLK) is active only when it is required. The cycle of the internal clock signal is not constant but depends on regeneration time of the comparator defined by the voltage difference at its inputs.

Figure 2:
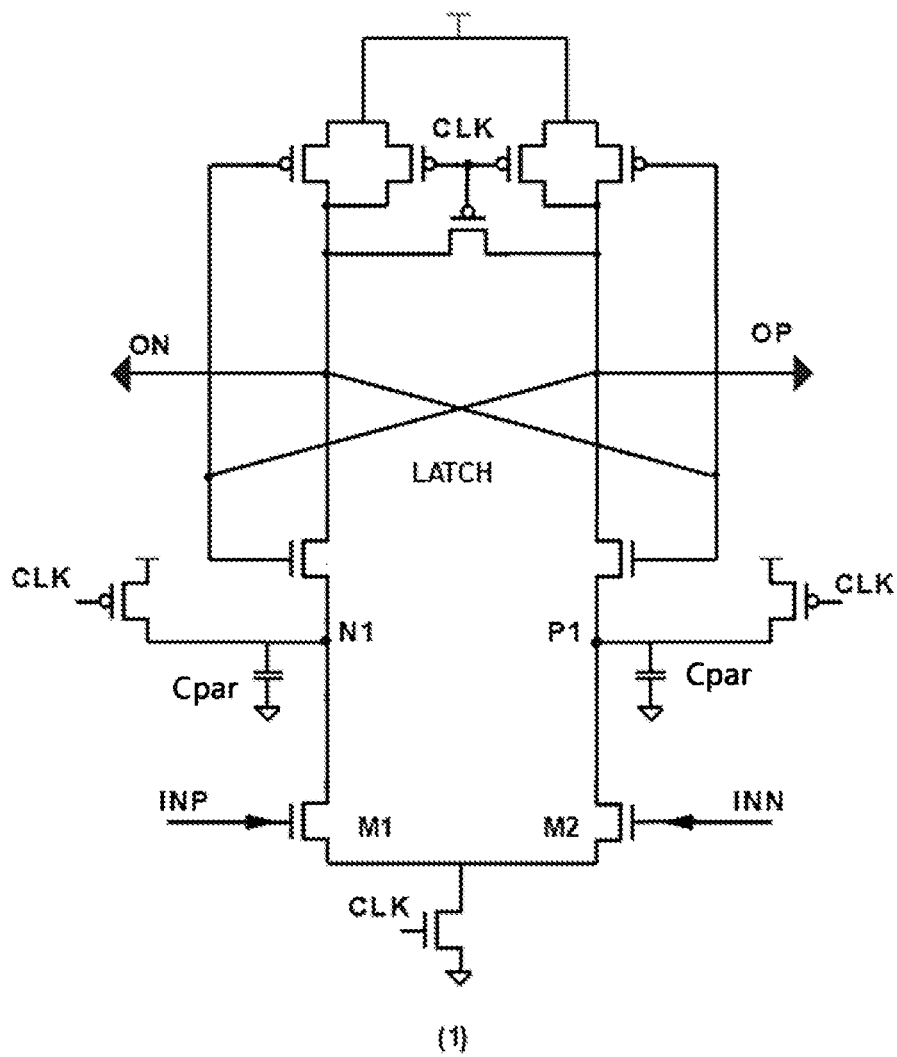
FIG. 2 is a schematic diagram of a conventional StrongArm comparator.
Figure 2:
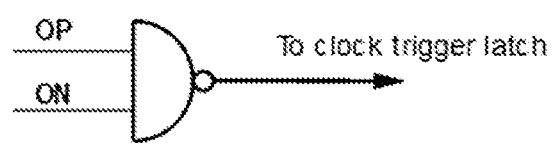
Figure 3:
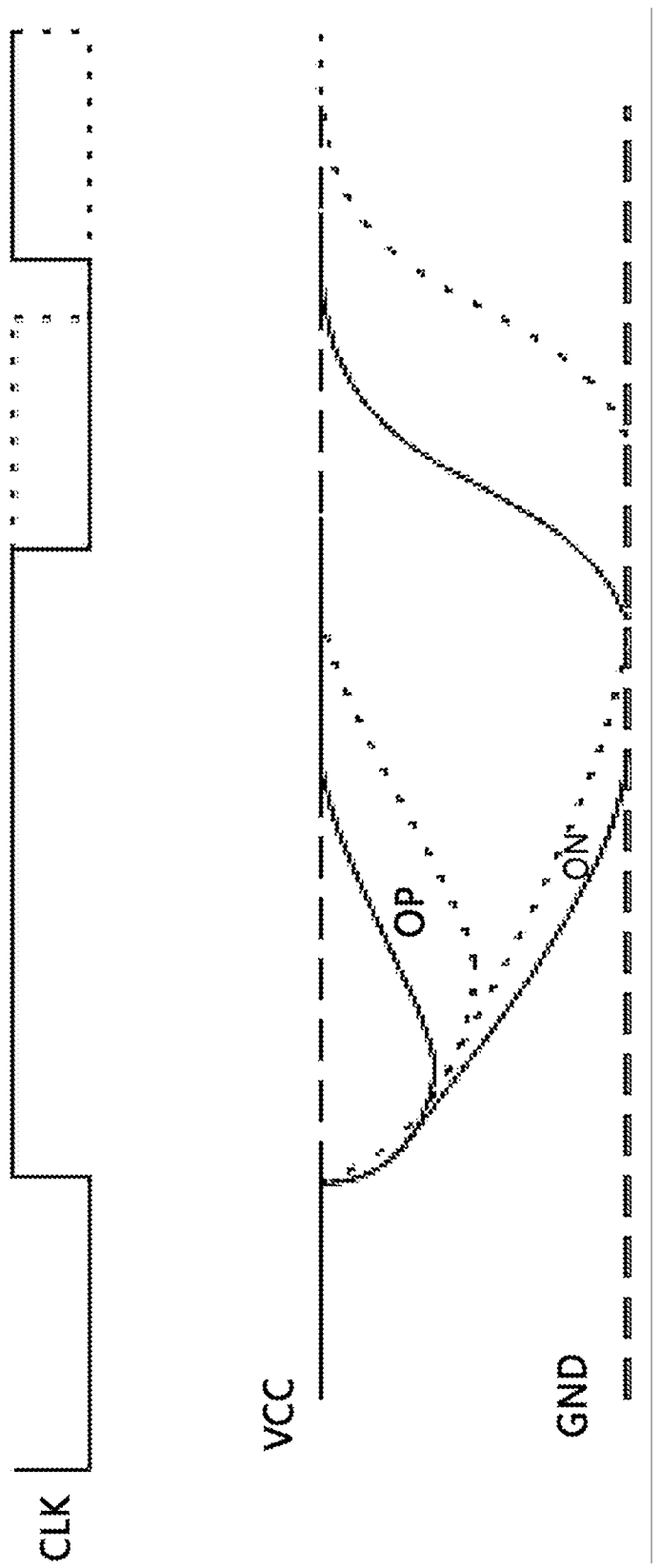
FIG. 3 is a timing diagram of outputs of a conventional StrongArm comparator depending on input signal strength.

FIG. 2 is a schematic diagram of a conventional StrongArm comparator which may be used in the SAR ADC of FIG. 1, and FIG. 3 is a timing diagram of the conventional StrongArm comparator, where the dotted lines indicate the case of differential input signals with smaller input voltages. This type of comparator is broadly used in SAR ADC design. In view of FIGS. 2 and 3, when the clock signal is set low, nodes ON, OP, N1, P1 are pre-charged to a high-level voltage (e.g., VCC). When the clock signal is set high, capacitors (Cpar) on nodes N1 and P1 begin to discharge to GND with a speed dependent on the gate voltage difference of input devices (the voltage difference between INP and INN), and then a complementary regenerative process of a latch begins.

As shown in FIG. 3, when CLK is set high, output voltages of nodes OP and ON pull down simultaneously, and then one of the output voltages of nodes OP and ON continues to pull down (e.g., the output voltage of node ON pulls down) while the other pulls up (e.g., the output voltage of node OP pulls up), which causes output voltage separation. The operation of the comparator finishes with the output voltage separation, which is detected by the ready detector, which in its turn pushes the clock signal to a low state through clock generator feedback (e.g., the RS latch for clock generation in FIG. 1). While the low clock state width is constant, the high clock state width depends on the differential input voltage. The smaller the differential input signal voltage, the larger the high clock state width.

Figure 4:
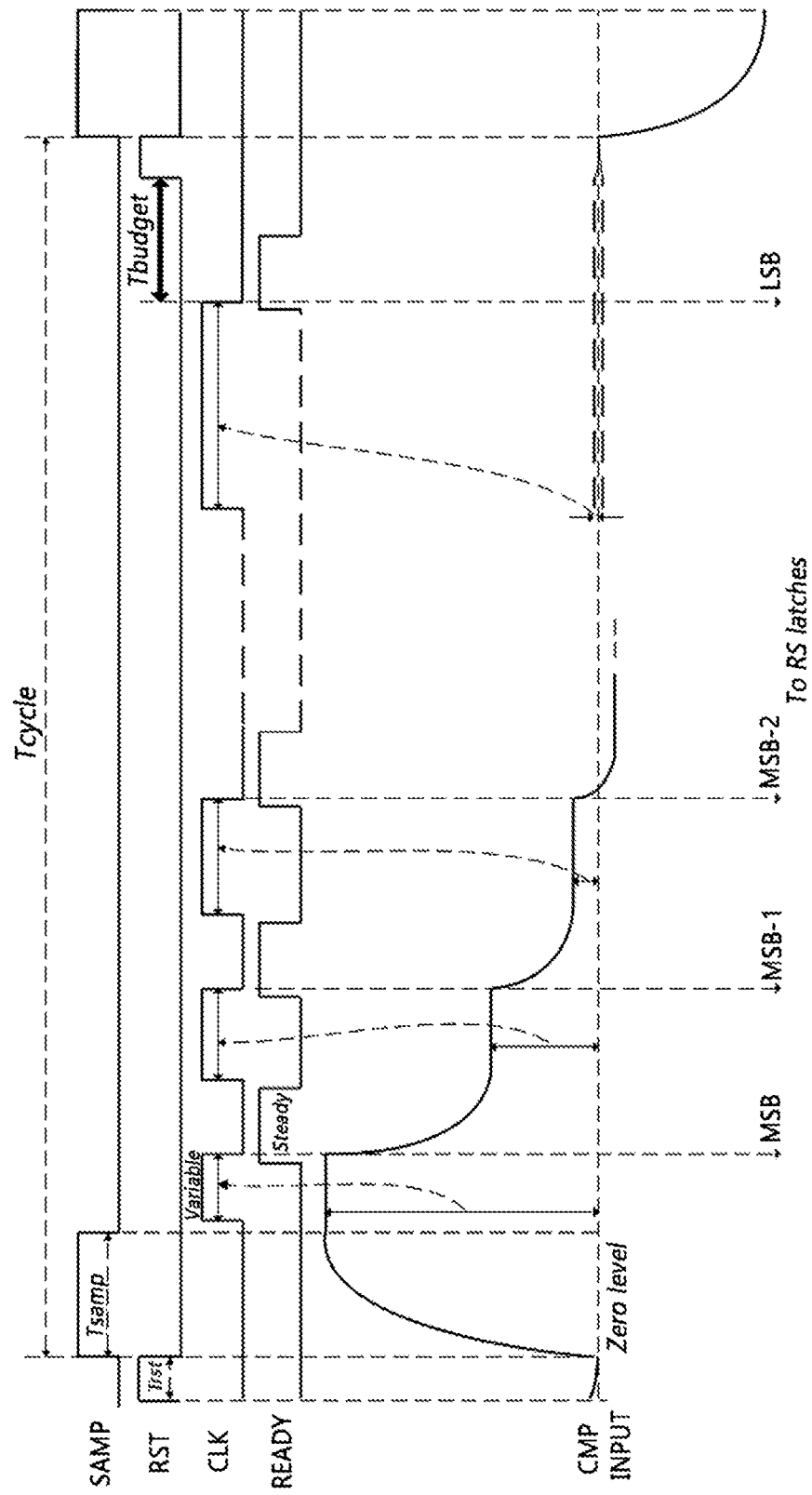
FIG. 4 is a timing diagram illustrating bits conversions corresponding to the asynchronous SAR ADC shown in FIG. 1.

FIG. 4 is a timing diagram illustrating bits conversions corresponding to the asynchronous SAR ADC shown in FIG. 1. For simplicity, the timing diagram illustrates the timing for conversion of the first three bits (MSB followed by MSB-1, then MSB-2) and the last bit (LSB).

External clock signal (e.g., SAMP signal) defines the cycle of SAR ADC (Tcycle). A reset (RST) signal may be external or created externally from the SAMP signal. Operation of the SAR ADC begins from normal RST which prepares CDAC and resets internal bits latches counter for the CDAC. During an active SAMP state, capacitors of the CDAC are charged to the input voltage difference. After the active SAMP state ends, internal asynchronous conversion process begins ping-ponging CLK and ready signals. When CLK is set high, the comparator is enabled. After an amount of time required to perform the comparison and convergence of the latch, the comparator has completed a comparison decision on a given bit, and the ready detector detects the comparison decision and generates a ready signal (e.g., the ready signal is set high). The controller then brings the comparator to a reset state (e.g., CLK is set low), where a duration of the reset state of the comparator may be defined by the OFF delay. The OFF delay synchronizes CDAC conversion time end with CLK high edge, ensuring CLK to be set high only after the CDAC conversion ends. The ready signal for the last bit stops bits conversions. Only after LSB is acquired, the RX system is ready for RST and next SAMP clock cycle. For successful conversion, the SAMP clock period should be wide enough to include all mentioned steps. Setting fastest possible SAMP clock frequency should be calculated according to the conversion timing budget (Tbudget).

Figure 5:
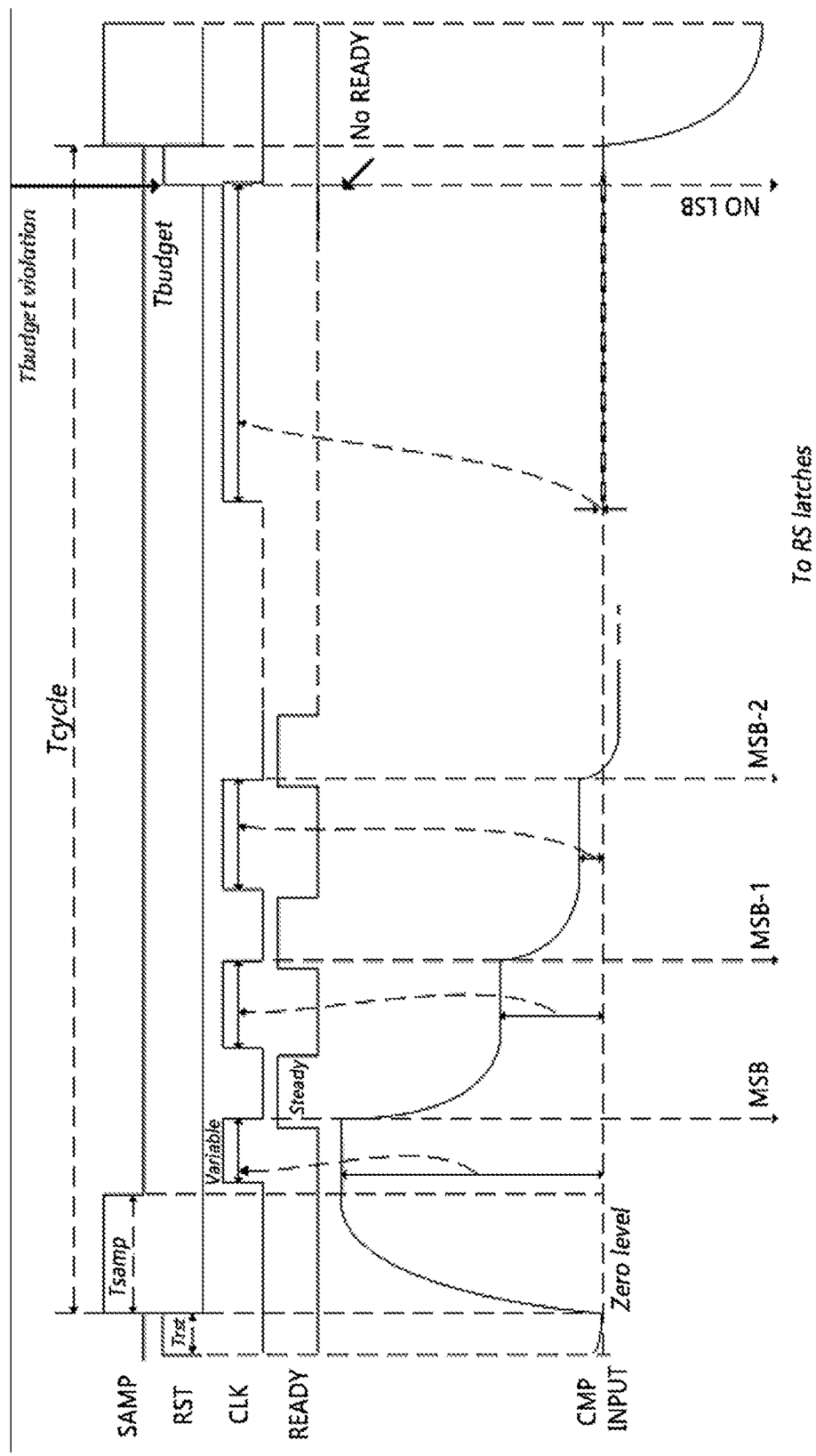
FIG. 5 is another timing diagram illustrating bits conversions in prior art.

In FIG. 4, Tbudget=Tcycle−Tsamp−Trst, where Tbudget refers to available time budget for asynchronous conversion. Since the internal clock cycle is varying (caused by different inputs, meta-state events, process corners, etc.), it is important to keep Tbudget positive for all possible cases. FIG. 4 illustrates bits conversions with no Tbudget violation. However, in some cases, for example, when the differential input of the comparator is relatively small, one of sub-cycle bits conversions takes a long time, LSB sub-cycle conversion may be delayed. FIG. 5 is a timing diagram illustrating bits conversions with Tbudget violation, for detailed description of the parts similar to FIG. 4, reference may be made to relevant parts of FIG. 4, which will not be repeated here for brevity. In the case where Tbudget is violated, at least LSB does not come out.

For the above-mentioned case, LSB is not resolved (no ready signal being high/active) at the moment when an active pulse of the reset signal comes. Thus, LSB bit is lost for the case.

In the aforementioned asynchronous SAR ADC, the reset signal simultaneously controls reset phases of the comparator and the rest parts (e.g., the CDAC), thus in some cases, e.g., the case illustrated in FIG. 5, before the LSB bit conversion ends, the comparator is reset. Hence, it may be beneficial to separate/decouple the reset phases of the comparator and other parts of the asynchronous SAR ADC (e.g., the CDAC), so that the reset of the CDAC would not affect the normal operation of the comparator, e.g., the reset phase of the comparator may come later than that of the CDAC.

The reset of the comparator separated from the reset of the rest parts of the asynchronous SAR ADC may be associated with a modified StrongArm comparator. The StrongArm comparator can also be referred to as a StrongArm dynamic comparator, a StrongArm comparator latch, etc.

Figure 6A:
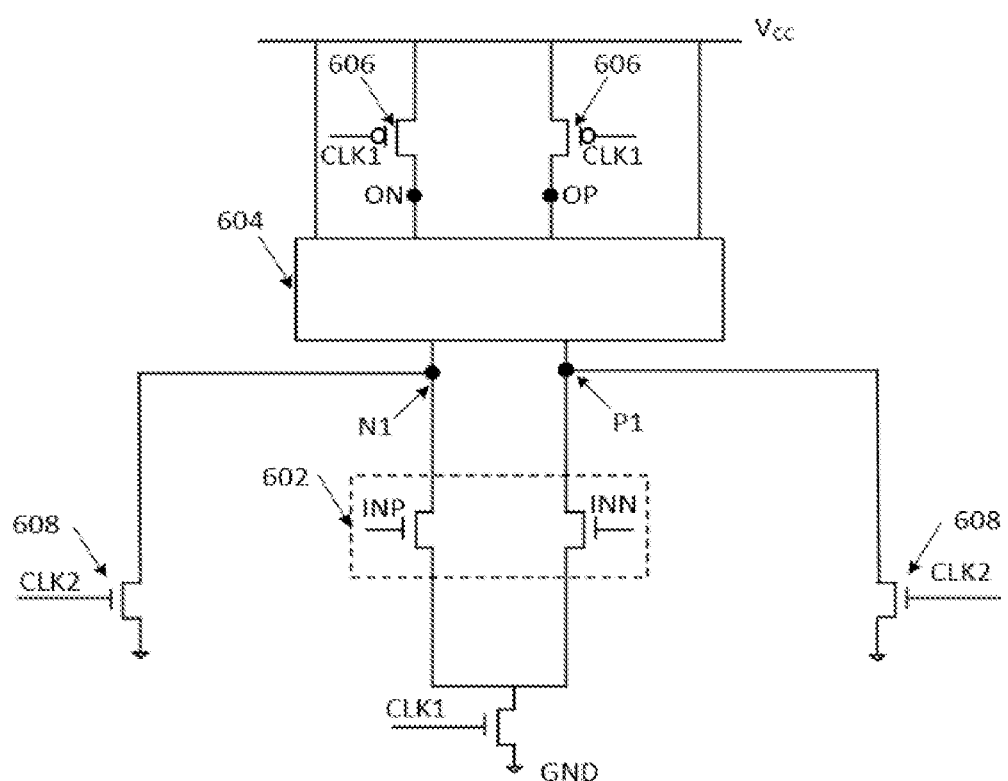
FIGS. 6A and 6B are schematic diagrams of exemplary circuits of the modified StrongArm comparator according to one or more embodiments of the present disclosure.
Figure 6B:
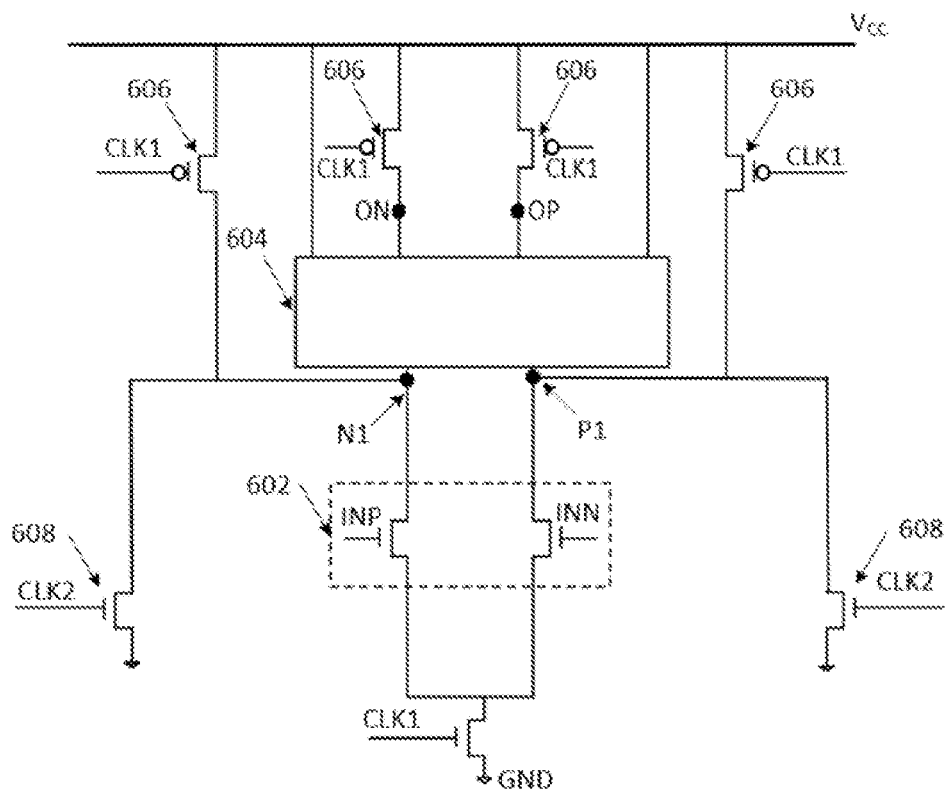
Figure 6C:
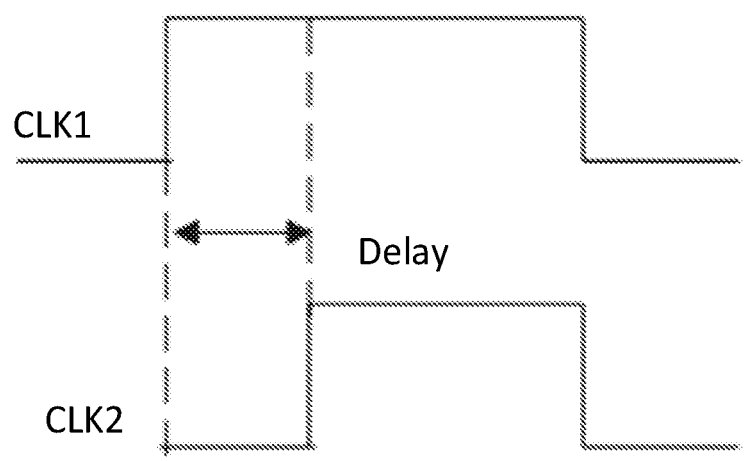
FIG. 6C is a timing diagram of clock signals associated with the modified StrongArm comparator according to one or more embodiments of the present disclosure.

FIGS. 6A-6B are schematic diagrams of exemplary circuits of the modified StrongArm comparator, and FIG. 6C is a timing diagram of clock signals associated with the modified StrongArm comparator. The modified StrongArm comparator will be elaborated with reference to FIGS. 6A-6C in the following.

As shown in FIGS. 6A and 6B, the StrongArm comparator may include an input module 602, a latch module 604 and a reset module, where the reset module includes a first reset unit 606 and a shunt unit 608. The latch module 604 is coupled between a first supply (e.g., VCC in FIG. 6A and FIG. 6B) and the input module 602, the first reset unit 606 is coupled between the first supply and internal nodes of the StrongArm comparator, and the shunt unit 608 is coupled between a second supply (e.g., ground shown in FIG. 6A and FIG. 6B) and coupling nodes of the input module 602 and the latch module 604. Here the internal nodes of the StrongArm comparator may include the coupling nodes (N1 and P1 in FIG. 6A and FIG. 6B), and/or, output nodes (ON and OP in FIG. 6A and FIG. 6B) from which a pair of differential output voltages as an output of the StrongArm comparator is output.

The input module 602 is configured to receive a pair of differential input voltages, and the latch module 604 is configured to generate, at the output nodes of the StrongArm comparator, a pair of differential output voltages. Operation of the first reset unit 606 is controlled by a first clock signal (e.g., CLK1 received at gates of the transistors in FIGS. 6A-6B and CLK1 shown in FIG. 6C), discharging of the coupling nodes through the input module 602 for triggering the generation of the pair of differential output voltages is activated by an active pulse of the first clock signal, and discharging of the coupling nodes through the shunt unit 608 is activated by an active pulse of a second clock signal (e.g., CLK2 received at gates of the transistors in FIGS. 6A-6B and CLK2 shown in FIG. 6C), where a leading edge of the active pulse of the second clock signal lags behind the leading edge of the active pulse of the first clock signal, and trailing edges of the first and second clock signals end simultaneously.

It should be noted that the specific transistors shown in FIG. 6A and FIG. 6B for the input module 602, the latch module 604 and the reset module are illustrative but not restrictive. These modules may each include several transistors, the number of transistors, connections for the transistors and types of the transistors for each of the above modules are not limited in the embodiments of the present disclosure. Besides, with regard to the first reset unit 606, sources of these transistors may be coupled to the first supply, drains of these transistors may be coupled to different internal nodes (FIG. 6A shows the case of being coupled to output nodes ON and OP, while FIG. 6B shows the case of being coupled to output nodes (ON and OP) and coupling nodes (N1 and P1)), and gates of these transistors may be configured to receive the first clock signal which is responsible for controlling the reset of these transistors, the specific controlling mechanism will be described later with an exemplary timing shown in FIG. 6C. With regard to the shunt unit 608, drains of these transistors in the shunt unit 608 may be coupled to the coupling nodes, sources of these transistors in the shunt unit 608 may be coupled to the second supply, and gates of these transistors in the shunt unit 608 may be configured to receive the second clock signal which is responsible for controlling the reset of these transistors, the specific controlling mechanism will be described later. Specific changes may be made with respect to connections of the transistors in the StrongArm comparator depending on the types of the transistors to ensure their normal working, which will not be detailed herein.

The first and second clock signals may respectively correspond to CLK1, CLK2 in FIGS. 6A-6C. In the present disclosure, active pulses of the first and second clock signals are set high, it should be noted that, the active pulses and the width of the delay are only illustrative but not restrictive, in complementary cases, the active pulses can also be set low.

With the modified StrongArm comparator, after some delay forming the leading edge of the active pulse of the first clock signal, initial voltage differences on the internal nodes of the comparator has already been established, the shunting unit is enabled by the second clock signal with a delayed leading edge of an active pulse of the second clock signal. This allows during the active pulse of the first clock signal to exclude the input devices from the latch regenerative process, stop storing voltages on gates of the input devices and further equalize inputs of the input devices if required by design while the comparator is still converging.

Regarding specific components for the input module and the shunt unit, in a possible implementation, the input module includes a pair of first transistors, the pair of first transistors is configured to respectively receive the pair of differential input voltages on the gates of the first transistors, and sources of the first transistors are coupled to a drain of a second transistor having a source being coupled to the second supply and a gate being configured to receive the first clock signal; and the shunt unit includes a pair of third transistors, each of the third transistors is coupled between a drain of a corresponding first transistor (which is a coupling node as mentioned above) and the second supply, and gates of the third transistors are configured to receive the second clock signal. The second transistor, which could also be referred to as a tail transistor, serves as a switch for controlling the opening states of the pair of first transistors. Specific components for other parts of the StrongArm comparator will be described later.

Figure 6D:
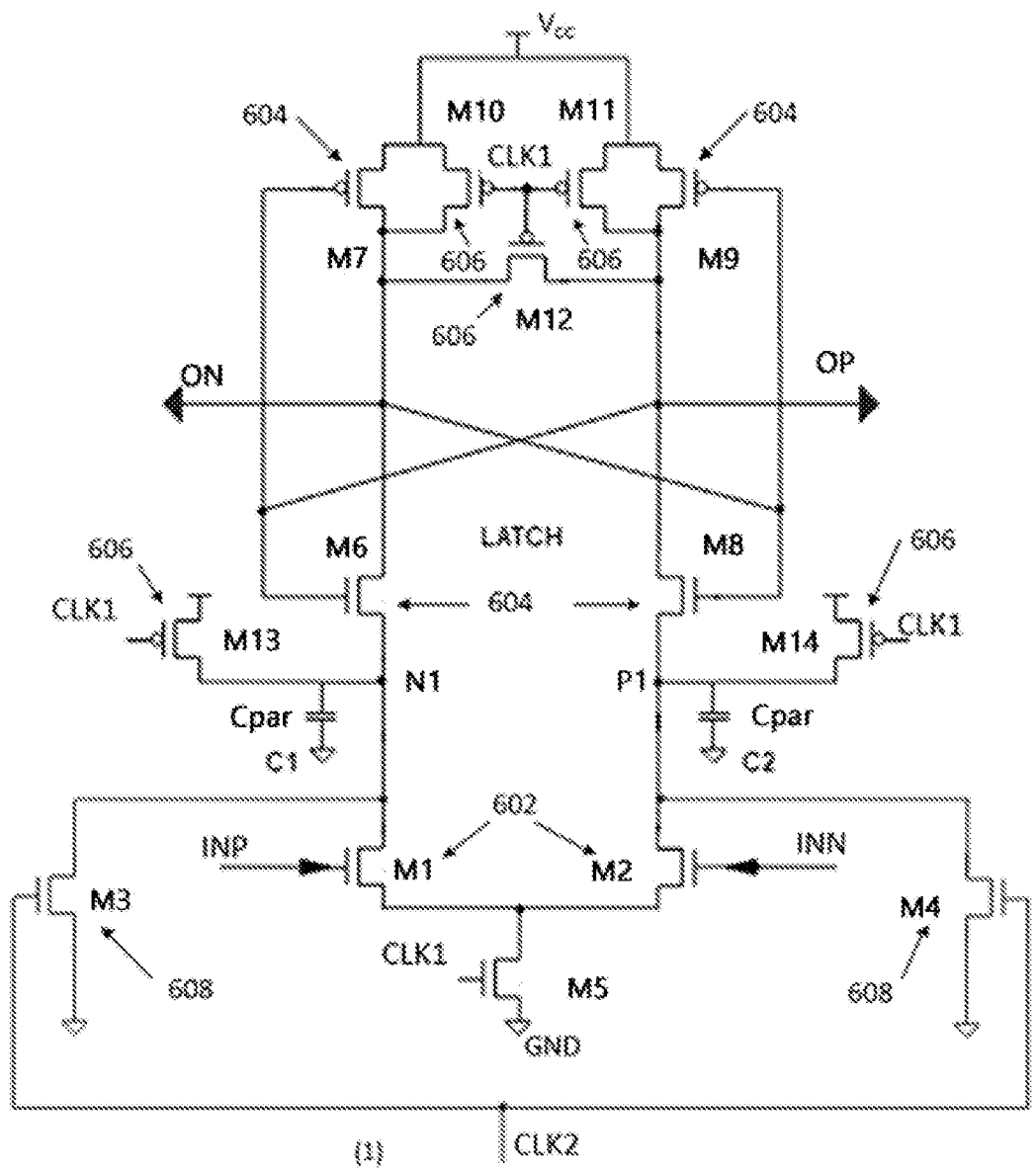
FIG. 6D is a schematic diagram of an exemplary circuit of the modified StrongArm comparator according to one or more embodiments of the present disclosure.
Figure 6D:
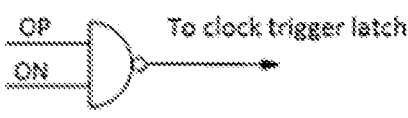

As shown in FIG. 6D, the StrongArm comparator includes differential input transistors (M1, M2), a pair of shunting devices (M3, M4), a clocked tail transistor M5, a cross-coupled latch (M6-M9) and clocked reset devices (M10-M14).

Transistors M1, M2 serve as input devices (the aforementioned input module) of the StrongArm comparator, the clocked tail transistor M5 (the aforementioned second transistor) is connected between the common node of the input devices and ground (the aforementioned second supply).

A latch (the aforementioned latch module) including a pair of cross-coupled CMOS devices (M6-M9) is connected between a supply (the aforementioned first supply) and the differential input transistors with outputs of the latch being outputs of the StrongArm comparator.

The clocked reset devices (M10, M11, M13, M14) are respectively connected between nodes ON, OP, N1, P1 and the supply (e.g., VCC), with an additional clocked reset device M12 connected between outputs of the comparator. The first clock signal is connected to gates of the clocked tail device M5 and the clocked reset devices. Here M10, M11, M13, M14 and M12 form a specific example of the aforementioned first reset unit.

A pair of N-type shunting devices (M3 and M4 which form a specific example of the aforementioned shunt unit) is connected between the common/coupling nodes of input-latch devices (N1, P1) and ground. The second clock signal with delayed active (rising in this case) edge is connected to the gates of the shunting devices.

The pair of first transistors included in the input module may correspond to transistors M1, M2 in FIG. 6D. The second transistor may correspond to transistor M5 in FIG. 6D. The pair of third transistors included in the shunt unit may correspond to shunting devices M3, M4 in FIG. 6D. The latch module may correspond to transistors M6, M7, M8 and M9 in FIG. 6D. The first reset unit may include two parts, one part with transistors M10, M11, M12; and another part with transistors M13, M14. It should be noted that, based on actual needs, there would be more or less transistors as components of the first reset unit. For example, in some designs, M12 could be omitted.

The coupling nodes of the input module and the latch module may correspond to nodes N1, P1 in FIG. 6D. The internal nodes of the StrongArm comparator may include output nodes of the StrongArm comparator and coupling nodes of the input module and the latch module, with the output nodes corresponding to nodes ON and OP, and the coupling nodes corresponding to nodes N1, P1 in FIG. 6D.

In the comparator as shown in FIG. 6D, the input devices (e.g., M1 and M2 in FIG. 6D), a pair of transistors (e.g., M6 and M8 in FIG. 6D) of the latch module close to the input devices, and the shunt devices (e.g., M3 and M4 in FIG. 6D) are negative Metal Oxide Semiconductor (NMOS) devices, while another pair of transistors (e.g., M7 and M9 in FIG. 6D) of the latch module away from the input devices and transistors included in the first reset unit (e.g., M10-M14 in FIG. 6D) are positive Metal Oxide Semiconductor (PMOS) devices, in this case, the first supply is a power supply (e.g., VCC) and the second supply is a ground. It should be also noted that, the types of the above mentioned devices can be exchanged for complementary, that is, the input devices, a pair of transistors of the latch module close to the input devices, and the shunt devices are PMOS devices, while another pair of transistors of the latch module away from the input devices and transistors included in the first reset unit are NMOS devices, in this case, the first supply is a ground and the second supply is a power supply (e.g., VCC).

Figure 7:
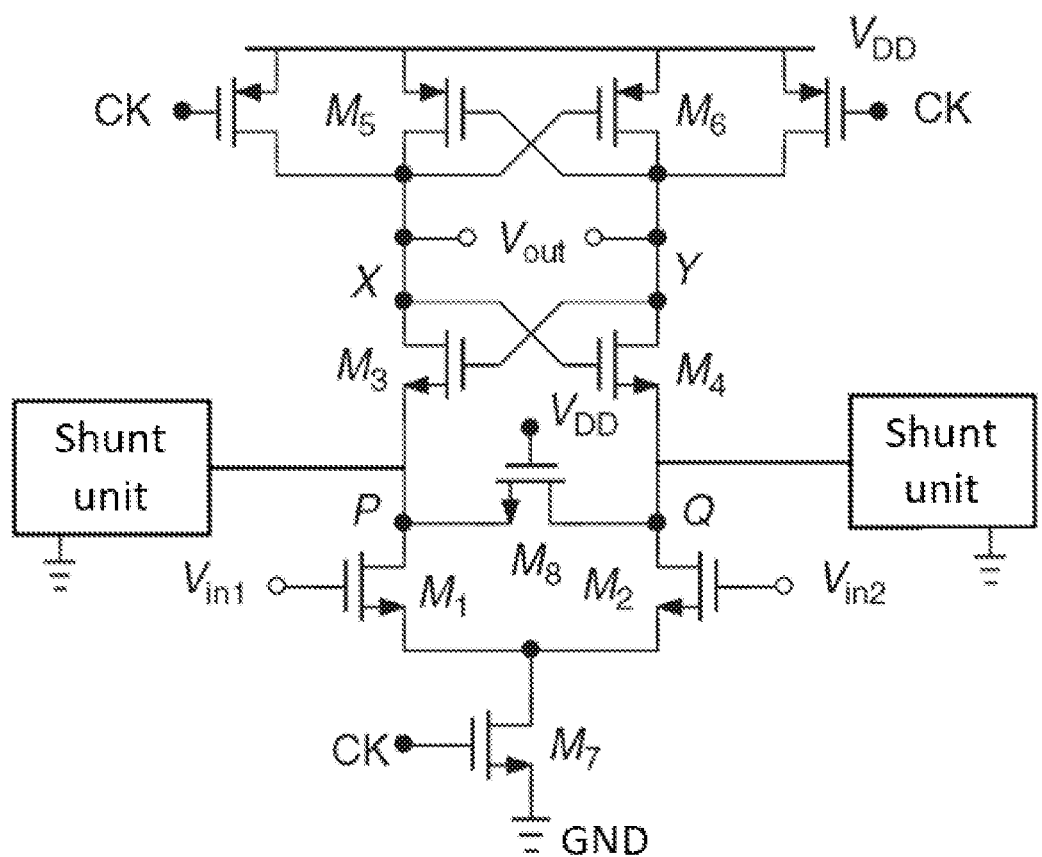
FIG. 7 is another schematic diagram of an exemplary circuit of the modified StrongArm comparator according to one or more embodiments of the present disclosure.
Figure 8:
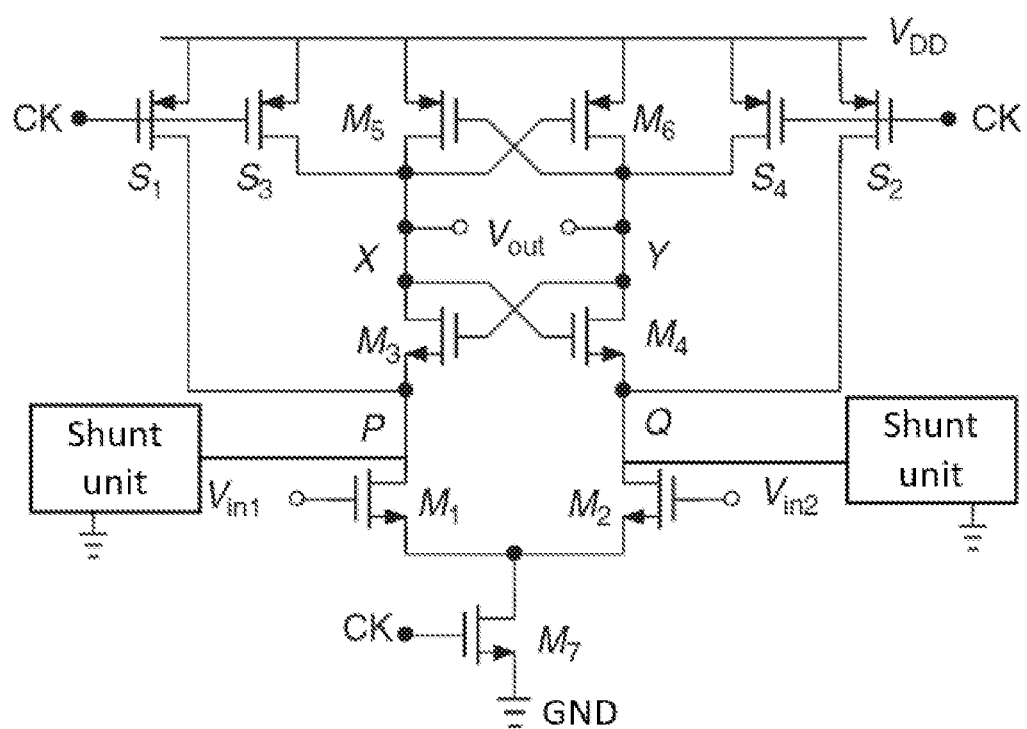
FIG. 8 is still another schematic diagram of an exemplary circuit of the modified StrongArm comparator according to one or more embodiments of the present disclosure.

In the above FIG. 6D, the shunt unit is added in parallel to the input devices plus the tail device of the conventional comparator in FIG. 2, and the structure of the modified comparator in FIG. 6D is illustrative but not restrictive. It should be noted that, based on the proposed shunt mechanism, the shunt unit can also be added in parallel to input devices of other StrongArm comparator variations, e.g., the comparators shown in FIG. 7 and FIG. 8, which is not limited in the present disclosure. For example, the shunt unit (e.g., formed by two transistors) may be added between nodes P&Q and ground in FIG. 7 and FIG. 8.

Besides, the internal nodes of the StrongArm comparator may include different nodes depending on specific implementations. For example, in FIG. 6D, the internal nodes include the output nodes of the latch module shown as ON and OP and the coupling nodes shown as N1 and P1; in FIG. 7, the internal nodes include the output nodes of the latch module (formed by M3-M6) shown as X and Y; in FIG. 8, the internal nodes include the coupling nodes of the latch module (formed by M3-M6) shown as P and Q.

Next, we will describe the proposed asynchronous SAR ADC including the above StrongArm comparator.

Figure 9:
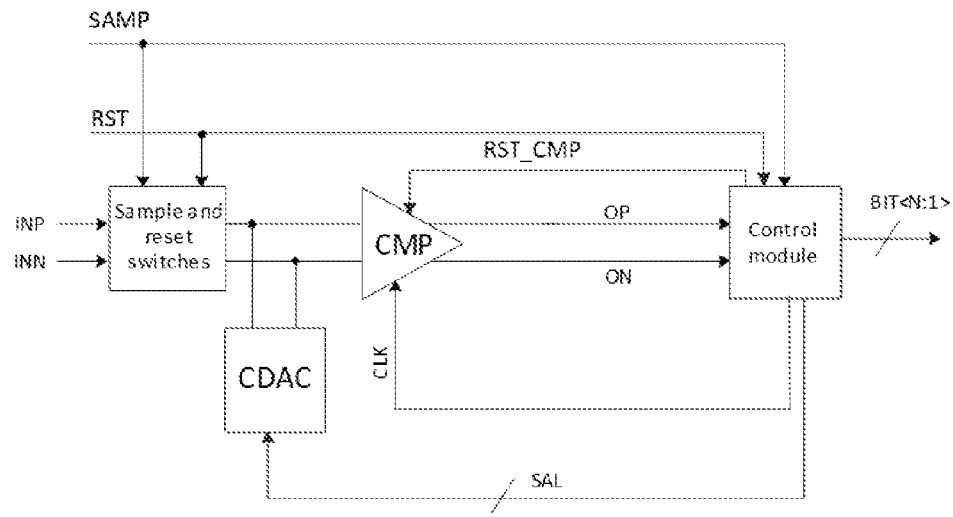
FIG. 9 is another block diagram of an asynchronous SAR ADC according to one or more embodiments of the present disclosure.
Figure 9:
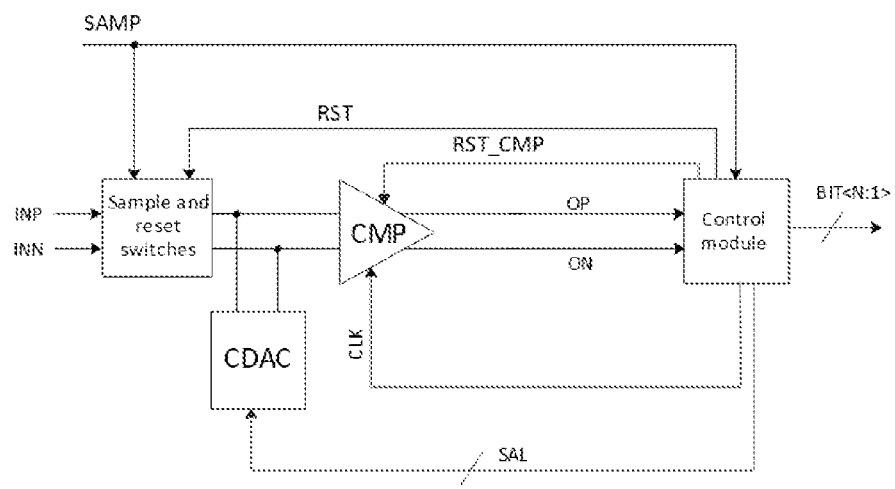

As shown in FIG. 9, the asynchronous SAR ADC includes: a StrongArm comparator (CMP in FIG. 9), a capacitive digital to analog converter (CDAC), sample and reset switches, and a control module; where differential outputs of the CDAC (or referred to as CDAC outputs for brevity) are coupled to an input module of the StrongArm comparator, control inputs of the CDAC (or referred to as inputs of the CDAC or CDAC inputs for brevity) are coupled to outputs of the control module, outputs of the StrongArm comparator are coupled to inputs of the control module.

Figure 11:
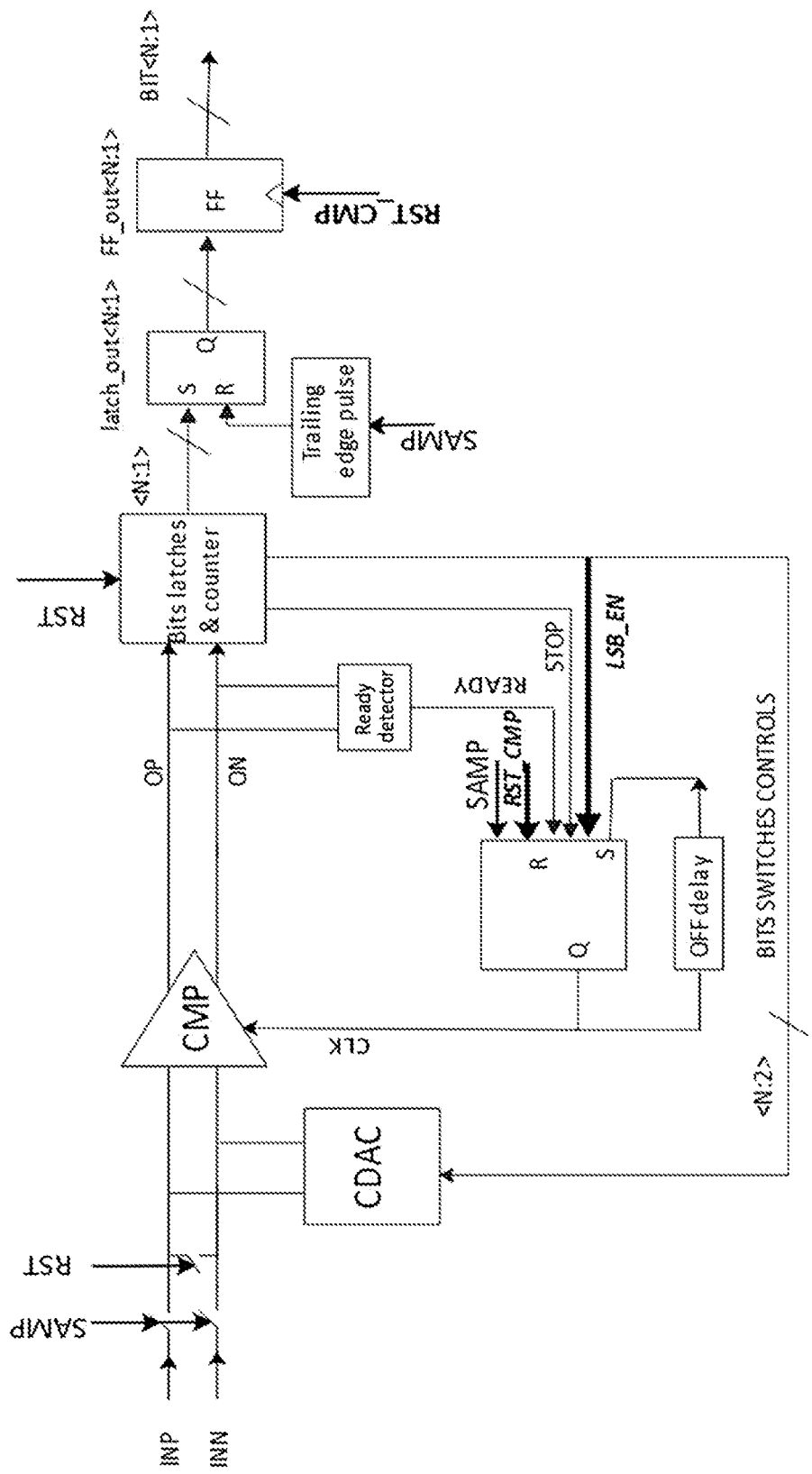
FIG. 11 is still another block diagram of an asynchronous SAR ADC according to one or more embodiments of the present disclosure.

The sample and reset switches of the asynchronous SAR ADC may include two input switches (e.g., the sample switches close to INP and INN under control of SAMP in FIG. 11) coupled between the differential analog input ends and the input module of the StrongArm comparator, and controlled to be conductive by the active pulse of the sampling signal; and a CDAC reset switch (e.g., the reset switch between INP and INN under control of RST in FIG. 11) coupled between the input module of the StrongArm comparator and controlled to be conductive by an active pulse of a second reset signal. When the sampling signal is active (e.g., set high), the input switches are turned on; otherwise, the input switches are turned off. When the second reset signal is active (e.g., set high), the CDAC reset switch is turned on, otherwise, the CDAC reset switch is turned off.

The CDAC is configured to generate a succession of two differential input voltages at the input module of the StrongArm comparator to successively approximate a sampled differential voltage acquired from differential analog input ends during an active pulse of a sampling signal (SAMP in FIG. 9); where the generation of the succession of two differential input voltages on the comparator inputs (inputs of the comparator) is based on successive approximation logic signals (SAL in FIG. 9) from the control module. Here, if one successive approximation logic signal carries one bit logic, there may be multiple successive approximation logic signals corresponding to multiple bits logic. In the case that one successive approximation logic signal carries multiple bits logic, one successive approximation logic signal is enough.

The StrongArm comparator is configured to generate, based on the first clock signal (CLK in FIG. 9) from the control module, a comparison signal representing a comparison result between the two differential input voltages, where the comparison result indicates a bit value of the digital output signals to be stored in the control module. The description of the aforementioned StrongArm comparator may also apply here. It should be noted that, if one digital output signal carries one bit value, there may be multiple digital output signals corresponding to multiple bits values. In the case that one digital output signal carries multiple bits values, one digital output signal is enough.

The control module is configured to generate a first clock signal for the StrongArm comparator based on the comparison signal, the sampling signal, a first reset signal (RST_CMP in FIG. 9) for resetting the StrongArm comparator, and a second reset signal that can be external (RST in (a) of FIG. 9) or internal (RST in (b) of FIG. 9) generated inside the control module, output the successive approximation logic signals to the CDAC based on the comparison signal, and output the digital output signals after all bit values of the digital output signals are converted. As one implementation, the control module may include the ready detection module (which is the case shown in FIG. 9), the controller (bits latches & counter), the RS latch for clock generation, the OFF delay, the RS latches for outputting digital bits one by one, and the flip flops for aligning all the digital bits, which will be described later with reference to FIG. 11. As another possible implementation, the control module and the ready detection module may be separated as two modules, which is not limited in the embodiments of the present disclosure.

The ready detection module (the ready detector in FIG. 11 and inside the control module in FIG. 9) is a part of a control loop and is configured to detect the comparison signal and output a ready signal indicating completion of the comparison. Outputs of nodes ON and OP may serve as inputs of the ready detector, and an output of the ready detector may be a ready signal indicating the end of the latch regenerative process. As one possible implementation, the ready detector is implemented as a NAND gate in the present disclosure (see FIG. 6D), it should be noted that, the ready detector can also be implemented as a XOR gate, which is not limited in the embodiments of the present disclosure.

It should be noted that in the above description of the asynchronous SAR ADC, with regard to operations of the StrongArm comparator and the control module (which may include the ready detection module located inside the control module), after the end of the sampling pulse (the active pulse of the sampling signal), the control model generates an active pulse of the clock signal (the aforementioned CLK1) moving the StrongArm comparator into the active state. A comparison result associated with a current bit value of the digital output signals is output to the ready detection module and a bit latch (to keep this result) located in the control module simultaneously, then the ready detection module detects and indicates said comparison event done and outputs a ready signal to the control module (e.g., the controller). The control module finishes the clock active pulse and brings the comparator into the reset state, where a duration of the reset state of the comparator is defined by an internal delay inside the control module. At the end of this delay, the control module generates a next active pulse of the clock signal for the StrongArm comparator and the process repeats to continue conversion of subsequent bits. The above process may be executed iteratively until all bit values of the digital output signals are obtained.

In a possible implementation, the discharging of the coupling nodes through the shunt unit is activated during conversion of a last bit of the digital output signals. As mentioned before, the discharging of the coupling nodes through the shunt unit is activated by an active pulse of a second clock signal. The second clock signal may be output by an AND gate with the first clock signal and an LSB enabling signal being inputs, where an active pulse of the LSB enabling signal indicates LSB conversion. That is, the shunt mechanism is applied for LSB conversion in the present disclosure, so that the probability of the case where the last bit does not come out can be substantially reduced, and full conversion for the bits can thus be ensured. In general, the shunt mechanism can be applied for the conversion of every bit.

Figure 10:
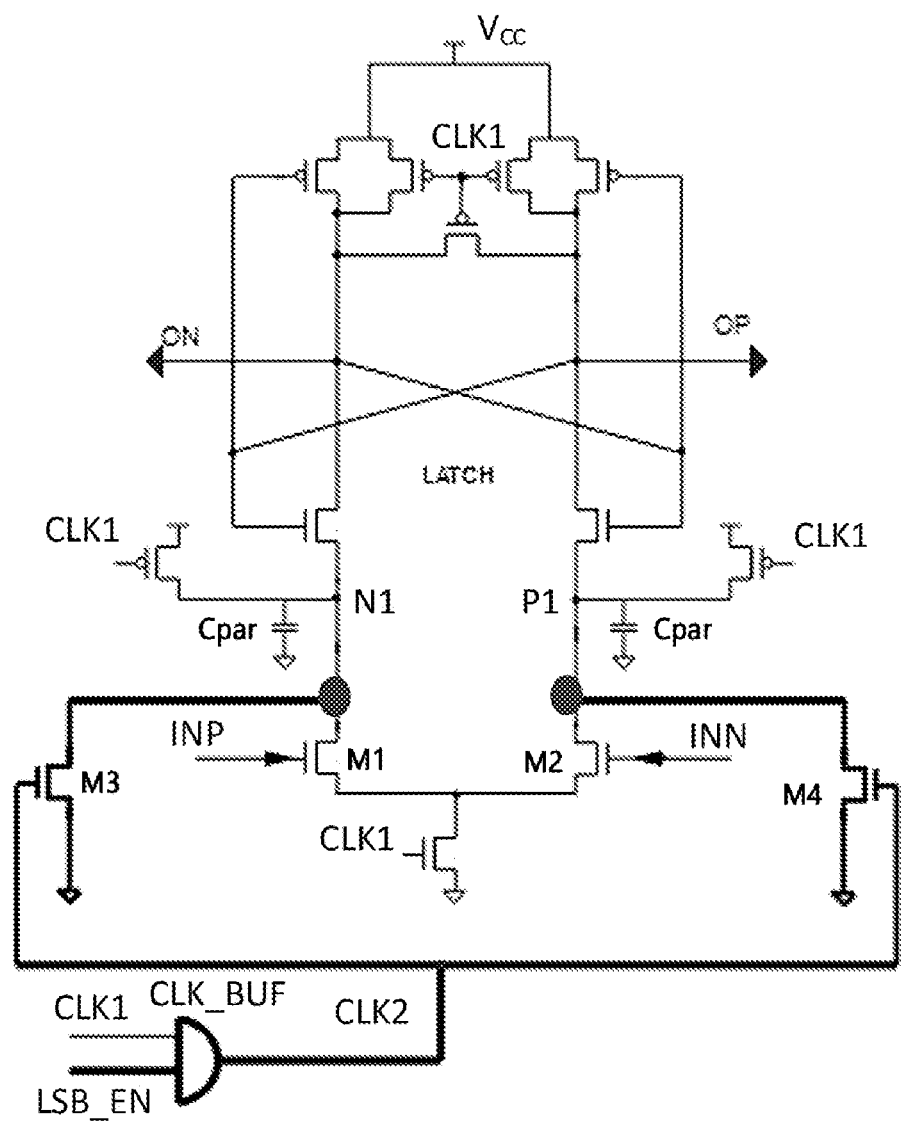
FIG. 10 is another schematic diagram of an exemplary circuit of the modified StrongArm comparator according to one or more embodiments of the present disclosure.

FIG. 10 is a schematic diagram of a StrongArm comparator in the case that the shunt mechanism is applied for LSB conversion. As shown in FIG. 10, on the basis of FIG. 2, an additional by-pass to ground transistors pair (M3, M4) is inserted in parallel to input devices (M1, M2) and the tail device of the comparator, and the additional by-pass to ground transistors pair is controlled by the buffered clock signal (the second clock signal), where the buffered clock signal (CLK_BUF/CLK2) is an output of an AND gate, an input of the AND gate are the first clock signal (CLK1) and the LSB enabling signal (LSB_EN signal). The delay of this AND gate is long enough to ensure initial disbalance on the internal nodes of the comparator.

The operation of the comparator in FIG. 10 may be similar to that of the foregoing mentioned StrongArm comparator, and will be briefly described. When the first clock signal is set low, nodes ON, OP, N1, P1 are pre-charged to a high-level voltage (e.g., VCC). For bits conversions other than LSB, when the first clock signal is set high, capacitors (Cpar) on nodes N1 and P1 begin to discharge to GND (ground, triangles shown in FIG. 10) through transistors M1 and M2 pair, with a speed dependent on the gate voltage difference of input devices M1 and M2 (the voltage difference between INP and INN), and then a complementary latch regenerative process begins. For the LSB bit conversion, when the first clock signal is set high, capacitors (Cpar) on nodes N1 and P1 can discharge through M1 and M2 to ground first, and after a delay when M3 and M4 are turned on, the additional by-pass to ground transistors is turned on, so the discharging of the capacitors to GND can also be through the additional by-pass to ground transistors pair. At this time, since the drains voltage difference of input devices M1 and M2 has already been established and the latch's recursive process for outputting the LSB has already begun, that is, input devices of the comparator can be excluded as long as the voltage disbalance has been remembered. Even if CDAC is reset, such resetting of the CDAC would not affect the latch's recursive process since input devices M1 and M2 are already excluded from the regenerative loop, so the resetting of the CDAC can be done while the comparator is still in active state ensuring the completion of the LSB bit conversion.

It should be noted that the capacitors (Cpar) shown in FIG. 6D and FIG. 10 are illustrative but not restrictive, the capacitors would also be parasitic capacitors of the input devices, which is not limited in the embodiments of the present disclosure.

In a possible implementation, an active pulse of the first reset signal is set inside the active pulse of the sampling signal for sampling the analog input signal. As mentioned before, the first reset signal is used for resetting the comparator. The active pulse of the first reset signal can be set inside the active pulse of the sampling signal, e.g., during the active pulse of the sampling signal where CADC samples the differential input voltage, the comparator can be still active and can receive reset only in the end of the sampling pulse.

In a possible implementation, the second reset signal is configured to reset the control module and the CDAC, and a leading edge of an active pulse of the second reset signal is triggered by a leading edge of the active pulse of the first clock signal. After activating the first clock signal (e.g., CLK1 shown in FIG. 10), with some delay (e.g., CLK2 in FIG. 10 is activated) shunt devices become active, simultaneously some part of the SAR ADC (e.g., the CDAC) can be reset except the comparator. That is, the second reset signal can be triggered earlier while the first reset signal is still not active. The first reset signal is delayed compared with the second reset signal, which creates extra time for the latch of the comparator to regenerate and develop a ready signal for LSB.

The comparator modification makes it possible to separate the reset of the comparator from the reset of the CDAC, that is, a separate reset is provided for the comparator, the CDAC can be reset without waiting for full conversion of the bits, and the conversion time of the SAR ADC can thus be improved.

In order to elaborate the SAR ADC more clearly, a specific example will be given in the following.

FIG. 11 is a block diagram of the SAR ADC with separate resets for the comparator and rest SAR parts. For the parts similar to FIGS. 1 and 9, reference may be made to relevant part of FIGS. 1 and 9, which will not be repeated here for brevity. The SAR ADC with one comparator and the shunt mechanism activated during LSB conversion is taken as an example in the present disclosure. It should be noted that, the SAR ADC can also be implemented for a design where there are multiple comparators, e.g., the number of comparators is equal to the number of bits, and in this case, as one possible implementation, the comparator associated with LSB will use the modified structure.

The CDAC samples the differential input signals during the active pulse of the external sampling clock signal, and obtains differential input voltages. As shown in FIG. 11, a sampling clock signal (SAMP) controls the input switches. When SAMP is active (e.g., set high), the input switches are ON; otherwise, the input switches are OFF. The comparator first compares the differential input voltages stored on the CDAC to produce a most significant bit (MSB) as a comparison result at its outputs (e.g., OP and ON shown in FIG. 11); and then receives a succession of voltages from the CDAC which are generated per successive approximation algorithm based on the output digital bits. Each previous bit defines the direction of associated CDAC weighted differential analog voltage for the next bit conversion.

The differential input voltages are sampled on the CDAC during the active pulse of the external sampling clock signal, the end of the active pulse of the external sampling clock signal activates the successive approximation process with each comparison result beginning from MSB stored on the controller which controls a next CDAC bit direction as inputs of the comparator.

Comparator outputs convergence (convergence of outputs of the comparator) can be detected by the ready detector that detects when the comparator has settled on a comparison decision (e.g., the output from the comparator is steady), and the ready detector generates a ready signal accordingly. A ready signal indicates the end of each of successful approximation conversion sub-cycles and moves the comparator into a reset sub-cycle through the RS latch for clock generation, where the reset length is designed to ensure full reset of the comparator and full conversion of the CDAC for providing next analog inputs voltages for the comparator. The ready detector may be implemented using any suitable circuitry, e.g., a NAND gate, a XOR gate, etc.

The ready signal is routed to the R input of the RS latch for clock generation. When the ready signal indicates completion of a comparison decision of the comparator (e.g., when the ready signal is set high) and it is not inside a sampling cycle (e.g., the external sampling clock signal is set low), this causes the RS latch for clock generation to generate a zero at Q output which creates a clock signal (CLK shown in FIG. 11) which when low resets the comparator. The Q output is also fed back to the S input, via the off delay, to return the Q output to high (and hence end the reset phase of the comparator, returning the comparator to the active phase). The off delay applies a preset time delay, to ensure that the clock signal controlling the comparator has a sufficient negative pulse width to fully reset the comparator.

The RS latch for clock generation receives a reset signal (RST_CMP shown in FIG. 11 which is a specific example of the first reset signal) to reset at the start of each conversion cycle. The RS latch for clock generation is also connected to receive a stop signal from the controller. The stop signal is activated (e.g., set to high) when the number of the stored bits counted by the controller reaches the expected N bits. The stop signal indicates the end of the current conversion cycle and stops the clock signal. The end of the SAMP signal triggers the beginning of conversion setting CLK to high.

As shown in FIG. 11, in addition to a reset signal RST_CMP for the comparator and the output FFs, there is another reset signal RST (a specific example of the second reset signal), which controls a reset switch coupled between the differential input signals, the controller (Bits latches & counter) and the CDAC. The reset signal RST_CMP is separated from the reset signal RST.

With reference to FIGS. 10 and 11, when CMP begins to resolve LSB (LSB_EN signal is set high), Cpar devices begin to discharge to ground with the speed defined by the voltage difference on the gates of input devices M1, M2. This voltage difference begins to build up on Cpar devices.

With a delay of CLK_BUF, input devices are by-passed by shunt devices M3, M4 which provide for the latch a path to the ground. The strength of the path to the ground is defined by shunt devices resistance enabling Cpar capacitors continue to discharge and the latch continues its recursive process.

The latch continues the recursive process based on the initial voltage difference stored on Cpar capacitors and also on other internal nodes of the comparator while inputs of comparator can go into simultaneous reset process not impacting convergence of the latch. Thus, reset of inputs (or outputs of CDAC, RST shown in FIG. 11) and reset of CMP (RST_CMP shown in FIG. 11) can be separated in time for LSB bit.

It should be noted that, the structure of the modified comparator in FIG. 10 is illustrative but not restrictive, there may be other variations with the additional by-pass to ground transistors pair, which is not limited in the present disclosure. It should also be noted that, the modified comparator in FIG. 10 and the SAR ADC in FIG. 11 are illustrative but not restrictive, there may be less or more devices, which is not limited in the present disclosure.

Figure 12:
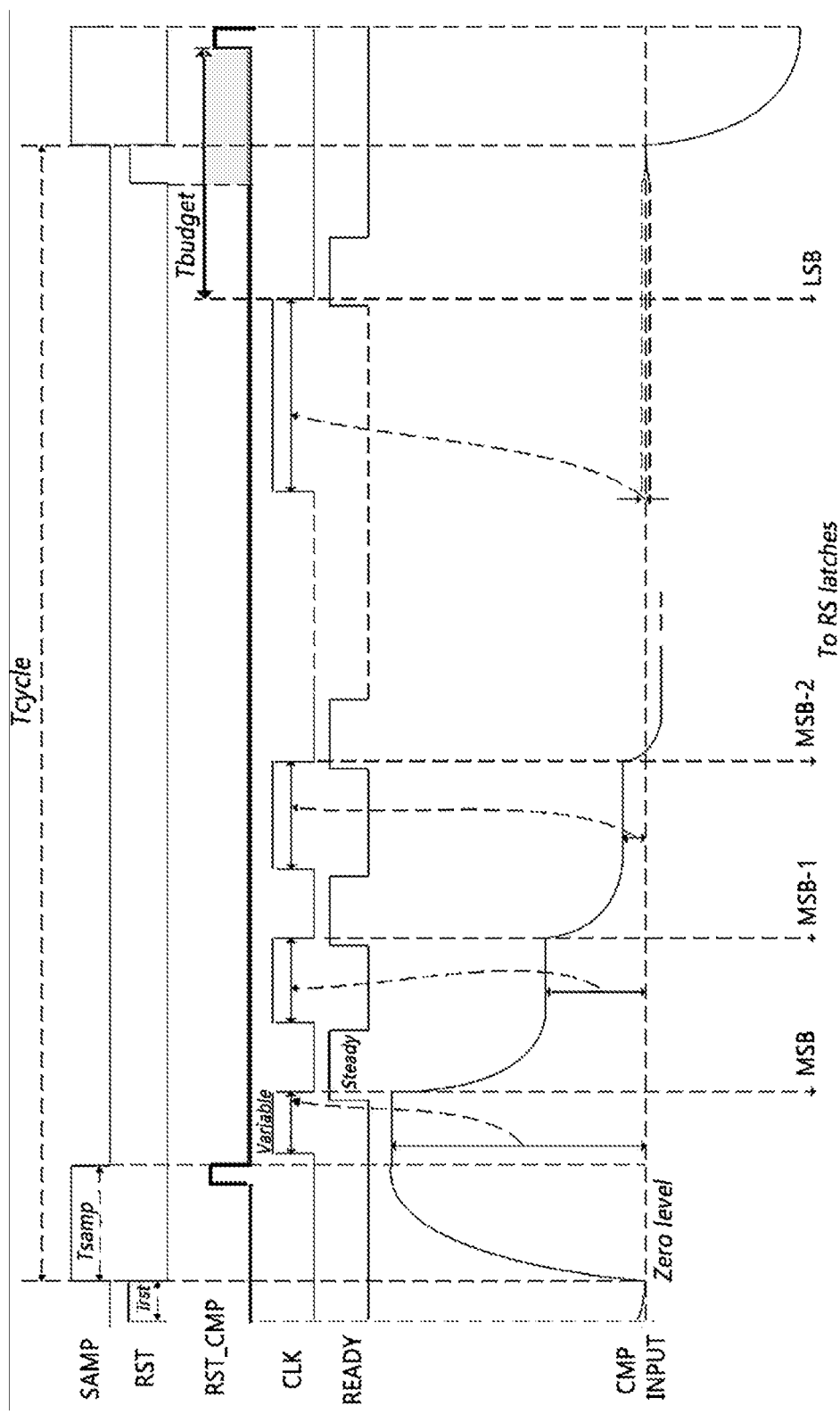
FIG. 12 is still another timing diagram illustrating bits conversions according to one or more embodiments of the present disclosure.
Figure 13:
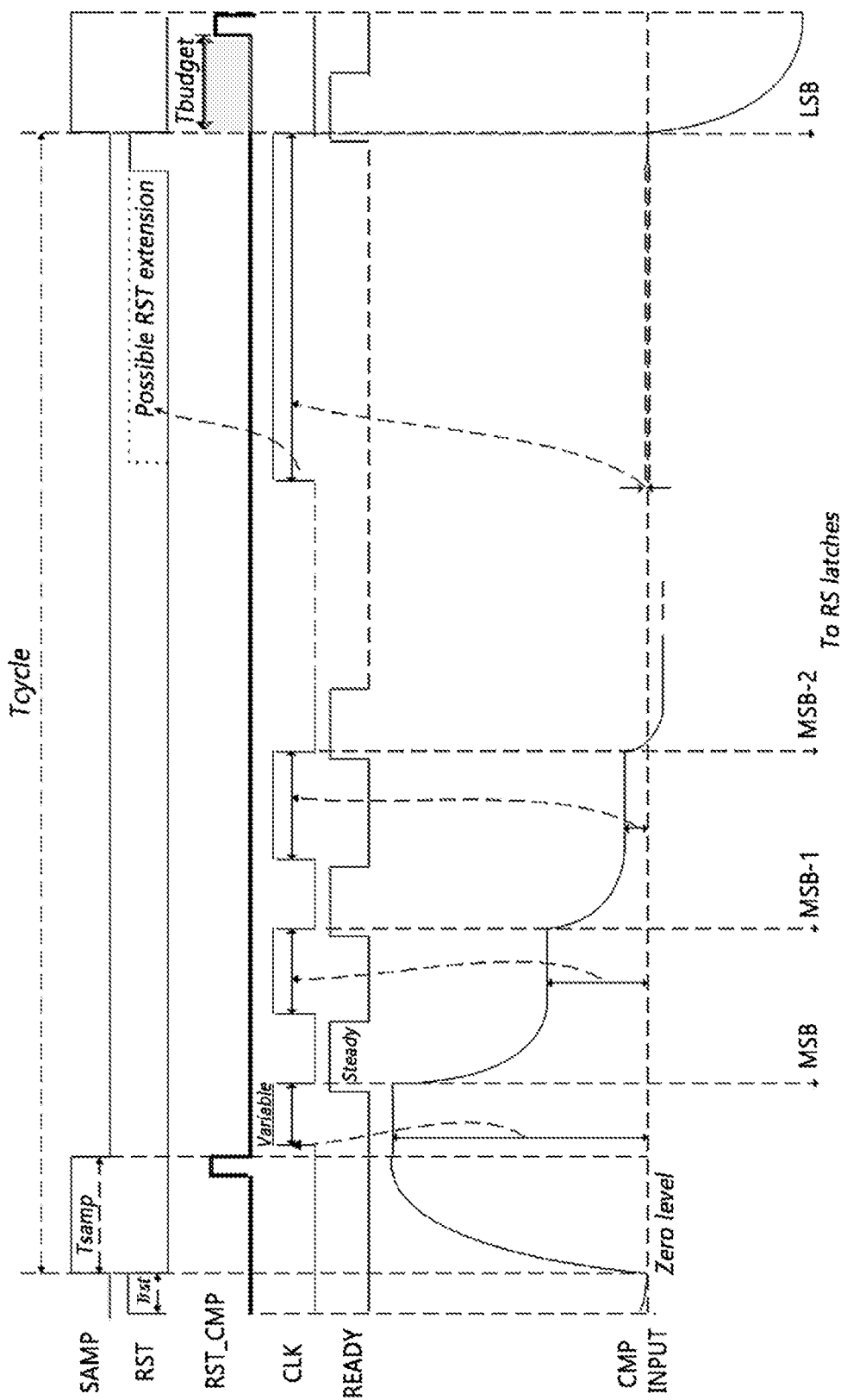
FIG. 13 is yet another timing diagram illustrating bits conversions according to one or more embodiments of the present disclosure.

With the above SAR ADC, the timing diagrams of bits conversions under the same condition of FIGS. 4 and 5 are illustrated in FIGS. 12 and 13 respectively, where FIG. 12 is a timing diagram illustrating the bits conversions for 'no Tbudget violation for non-modified SAR ADC case' using the modified SAR ADC, while FIG. 13 is a timing diagram illustrating bits conversions for 'Tbudget violation for non-modified SAR ADC case' using the modified SAR ADC. For detailed description of the parts similar to FIGS. 4 and 5, reference may be made to relevant part of FIGS. 4 and 5, which will not be repeated here for brevity.

For bits conversions with no Tbudget violation, it can be seen from FIGS. 4 and 12, in the SAR ADC before modification, the comparator and the rest parts of the SAR ADC share the reset signal, specifically, for LSB bit conversion, as shown in FIG. 4, the reset signal is active (e.g., set high) after the ready signal corresponding to LSB bit is active (e.g., set high). While in the modified SAR ADC, the reset of the comparator (e.g., RST_CMP signal) can be separated from other parts which multiplex the RST signal as their reset signals. As shown in FIG. 12, there is no Tbudget violation, LSB bit can be resolved (the ready signal corresponding to LSB bit can be active). As can be seen from comparing Tbudget between FIG. 4 and FIG. 12, though there is no Tbudget violation between both cases, the modified ADC has much higher Tbudget which potentially gives space for increasing the speed of conversion by reducing the external SAMP clock period.

Similar to the above analysis, for bits conversions with Tbudget violation, it can be seen from FIGS. 5 and 13, with the modified SAR ADC, the reset signal for the comparator is active after the ready signal corresponding to LSB bit is active, and the reset signal for other parts is active without waiting for the ready signal corresponding to LSB bit. Modified ADC still has substantial Tbudget while the non-modified ADC does not have any Tbudget resulting in loss of LSB. The same conclusion about the SAMP clock is valid for this case, since while for the non-modified ADC it is required to reduce the external SAMP clock frequency, the modified ADC does not require it.

In view of the above, the modification of the comparator is implemented by adding shunt devices by-passing the input devices of the comparator with a delayed clock signal (CLK2). By adding a separate reset for the comparator which may be moved inside the active pulse of the SAMP signal, the separation of the reset of the comparator and the reset of the rest parts of the SAR ADC is implemented. In addition, shunt mechanism is applied for LSB bit conversion for illustrative purpose. It should be noted that, the shunt mechanism can be applied for every bit, which is not limited in the present disclosure.

Tcycle budget is improved (increased), which results in at least one or combination of the following: for interleaved SAR ADC, higher clock rates to be met with the same interleaved sub-channels number; for the same clock rate less interleaved sub-channels and as a result less SAR ADC macro area and power required; for the same clock rate and interleaved sub-channels number, less power consumption achieved by slowing down internal asynchronous clock, reducing power hungry high speed components by optimizing them for less current, while the same/similar effect can be achieved by reducing supply level.

The modified comparator enables CDAC and CMP reset separation, CDAC related reset can be enabled while CMP is still processing LSB output, and CMP reset can be moved further into SAMP active domain. It should be noted that, the technical concept of the present disclosure can be applied to a single SAR ADC with higher clock rate, and can also be applied to an interleaved SAR ADC with higher clock rate or with the same clock rate but less sub-channels/ less area/less power consumption.

The embodiments may further be described using the following clauses.

1. A StrongArm comparator, including:
an input module, configured to receive a pair of differential input voltages;
a latch module, coupled between a first supply and the input module, and configured to generate a pair of differential output voltages;
a reset module, including a first reset unit and a shunt unit, where the first reset unit is coupled between the first supply and internal nodes of the StrongArm comparator, and operation of the first reset unit is controlled by a first clock signal; where the shunt unit is coupled between a second supply and coupling nodes of the input module and the latch module;
where discharging of the coupling nodes through the input module for triggering the generation of the pair of differential output voltages is activated by an active pulse of the first clock signal, and discharging of the coupling nodes through the shunt unit is activated by an active pulse of a second clock signal, where a leading edge of the active pulse of the second clock signal lags behind a leading edge of the active pulse of the first clock signal, and trailing edges of the first and second clock signals end simultaneously.

2. The StrongArm comparator according to clause 1, where
the input module includes a pair of first transistors, the pair of first transistors is configured to respectively receive the pair of differential input voltages on gates of the first transistors, and sources of the first transistors are coupled to a drain of a second transistor having a source being coupled to the second supply and a gate being configured to receive the first clock signal;
the shunt unit includes a pair of third transistors, each of the third transistors is coupled between a drain of a corresponding first transistor and the second supply, and gates of the third transistors are configured to receive the second clock signal.

3. An asynchronous successive approximation register (SAR) analog-to-digital converter (ADC), configured to convert an analog input signal into digital output signals and including: the StrongArm comparator according to clause 1, a capacitive digital to analog converter (CDAC) and a control module;
where differential outputs of the CDAC are coupled to the input module of the StrongArm comparator, inputs of the CDAC are coupled to outputs of the control module, outputs of the StrongArm comparator are coupled to inputs of the control module;
the CDAC is configured to generate a succession of two differential input voltages at the input module of the StrongArm comparator to successively approximate a sampled differential voltage acquired from differential analog input ends during an active pulse of a sampling signal; where the generation of the succession of two differential input voltages is based on successive approximation logic signals from the control module;
the StrongArm comparator is configured to generate, based on the first clock signal from the control module, a comparison signal representing a comparison result between the two differential input voltages, where the comparison result indicates a bit value of the digital output signals to be stored in the control module;
the control module is configured to detect the comparison signal, generate the first clock signal for the StrongArm comparator based on the detection of the comparison signal, the sampling signal and a first reset signal for resetting the StrongArm comparator, output the successive approximation logic signals to the CDAC based on the comparison signal, and output the digital output signals after all bit values of the digital output signals are converted.

4. The SAR ADC according to clause 3, where
the input module includes a pair of first transistors, the pair of first transistors is configured to respectively receive the pair of differential input voltages on gates of the first transistors, and sources of the first transistors are coupled to a drain of a second transistor having a source being coupled to the second supply and a gate being configured to receive the first clock signal;
the shunt unit includes a pair of third transistors, each of the third transistors is coupled between a drain of a corresponding first transistor and the second supply, and gates of the third transistors are configured to receive the second clock signal.

5. The SAR ADC according to clause 3 or 4, where the discharging of the coupling nodes through the shunt unit is activated during conversion of a last bit of the digital output signals.

6. The SAR ADC according to any one of clauses 3 to 5, where an active pulse of the first reset signal is inside the active pulse of the sampling signal for sampling the analog input signal.

7. The SAR ADC according to any one of clauses 3 to 6, further including two input switches coupled between the differential analog input ends and the input module of the StrongArm comparator, and controlled to be conductive by the active pulse of the sampling signal; and a CDAC reset switch coupled between the input module of the StrongArm comparator and controlled to be conductive by an active pulse of a second reset signal.

8. The SAR ADC according to clauses 7, where the second reset signal is configured to reset the control module and the CDAC, and a leading edge of an active pulse of the second reset signal is triggered by a leading edge of the active pulse of the first clock signal during conversion of a last bit of the digital output signals.

The present disclosure may be embodied in other specific forms without departing from the subject matter of the claims. The described example embodiments are to be considered in all respects as being only illustrative and not restrictive. Selected features from one or more of the above-described embodiments may be combined to create alternative embodiments not explicitly described, features suitable for such combinations being understood within the scope of this disclosure.

All values and sub-ranges within disclosed ranges are also disclosed. Also, although the systems, devices and processes disclosed and shown herein may include a specific number of elements/components, the systems, devices and assemblies could be modified to include additional or fewer of such elements/components. For example, although any of the elements/components disclosed may be referenced as being singular, the embodiments disclosed herein could be modified to include a plurality of such elements/components. The subject matter described herein intends to cover and embrace all suitable changes in technology.

Although embodiments have been described above with reference to the accompanying drawings, those of skill in the art will appreciate that variations and modifications may be made without departing from the scope thereof as defined by the appended claims.

What is claimed is:

1. A StrongArm comparator, comprising:
   an input module, configured to receive a pair of differential input voltages;
   a latch module, coupled between a first supply and the input module, and configured to generate a pair of differential output voltages; and
   a reset module, comprising a first reset unit and a shunt unit, wherein the first reset unit is coupled between the first supply and internal nodes of the StrongArm comparator, and operation of the first reset unit is controlled by a first clock signal, wherein the shunt unit is coupled between a second supply and coupling nodes of the input module and the latch module,
   wherein discharging of the coupling nodes through the input module for triggering generation of the pair of differential output voltages is activated by an active pulse of the first clock signal, and discharging of the coupling nodes through the shunt unit is activated by an active pulse of a second clock signal, wherein a leading edge of the active pulse of the second clock signal lags behind a leading edge of the active pulse of the first clock signal, and trailing edges of the first clock signal and the second clock signal end simultaneously.

2. The StrongArm comparator according to claim 1, wherein:
   the input module comprises a pair of first transistors, the pair of first transistors is configured to respectively receive the pair of differential input voltages on gates of the first transistors, and sources of the first transistors are coupled to a drain of a second transistor having a source being coupled to the second supply and a gate being configured to receive the first clock signal; and
   the shunt unit comprises a pair of third transistors, each of the third transistors is coupled between a drain of a corresponding first transistor and the second supply, and gates of the third transistors are configured to receive the second clock signal.

3. An asynchronous successive approximation register (SAR) analog-to-digital converter (ADC), configured to convert an analog input signal into digital output signals and comprising: a StrongArm comparator, a capacitive digital to analog converter (CDAC) and a control module;
   wherein the StrongArm comparator comprises:
      an input module, configured to receive a pair of differential input voltages,
      a latch module, coupled between a first supply and the input module, and configured to generate a pair of differential output voltages, and
      a reset module, comprising a first reset unit and a shunt unit, wherein the first reset unit is coupled between the first supply and internal nodes of the StrongArm comparator, and operation of the first reset unit is controlled by a first clock signal, wherein the shunt unit is coupled between a second supply and coupling nodes of the input module and the latch module,
      wherein discharging of the coupling nodes through the input module for triggering generation of the pair of differential output voltages is activated by an active pulse of the first clock signal, and discharging of the coupling nodes through the shunt unit is activated by an active pulse of a second clock signal, wherein a leading edge of the active pulse of the second clock signal lags behind a leading edge of the active pulse of the first clock signal, and trailing edges of the first clock signal and the second clock signal end simultaneously;
   wherein differential outputs of the CDAC are coupled to the input module of the StrongArm comparator, inputs of the CDAC are coupled to outputs of the control module, outputs of the StrongArm comparator are coupled to inputs of the control module;
   the CDAC is configured to generate a succession of two differential input voltages at the input module of the StrongArm comparator to successively approximate a sampled differential voltage acquired from differential analog input ends during an active pulse of a sampling signal;
   wherein generation of the succession of the two differential input voltages is based on successive approximation logic signals from the control module;
   the StrongArm comparator is configured to generate, based on the first clock signal from the control module, a comparison signal representing a comparison result between the two differential input voltages, wherein the comparison result indicates a bit value of the digital output signals to be stored in the control module; and
   the control module is configured to detect the comparison signal, generate the first clock signal for the StrongArm comparator based on detection of the comparison signal, the sampling signal and a first reset signal for resetting the StrongArm comparator, output the successive approximation logic signals to the CDAC based on the comparison signal, and output the digital output signals after all bit values of the digital output signals are converted.

4. The SAR ADC according to claim 3, wherein:
   the input module comprises a pair of first transistors, the pair of first transistors is configured to respectively receive the pair of differential input voltages through gates of the first transistors, and sources of the first transistors are coupled to a drain of a second transistor having a source being coupled to the second supply and a gate being configured to receive the first clock signal; and
   the shunt unit comprises a pair of third transistors, each of the third transistors is coupled between a drain of a corresponding first transistor and the second supply, and gates of the third transistors are configured to receive the second clock signal.

5. The SAR ADC according to claim 3, wherein the discharging of the coupling nodes through the shunt unit is activated during conversion of a last bit of the digital output signals.

6. The SAR ADC according to claim 3, wherein an active pulse of the first reset signal is inside the active pulse of the sampling signal for sampling the analog input signal.

7. The SAR ADC according to claim 3, further comprising two input switches coupled between the differential analog input ends and the input module of the StrongArm comparator, and controlled to be conductive by the active pulse of the sampling signal; and a CDAC reset switch coupled between the input module of the StrongArm comparator and controlled to be conductive by an active pulse of a second reset signal.

8. The SAR ADC according to claim 7, wherein the second reset signal is configured to reset the control module and the CDAC, and a leading edge of the active pulse of the second reset signal is triggered by the leading edge of the active pulse of the first clock signal during conversion of a last bit of the digital output signals.

* * * * *